US005457657A

United States Patent [19]

Suh

[11] Patent Number: 5,457,657
[45] Date of Patent: Oct. 10, 1995

[54] HIGH-SPEED SENSE AMPLIFIER HAVING FEEDBACK LOOP

[75] Inventor: Jeung W. Suh, Kyoungki-do, Rep. of Korea

[73] Assignee: Hyundai Electronics Industries Co., Ltd., Kyoungki-do, Rep. of Korea

[21] Appl. No.: 310,255

[22] Filed: Sep. 21, 1994

[30] Foreign Application Priority Data

Sep. 22, 1993 [KR] Rep. of Korea .................. 93-19325

[51] Int. Cl.$^6$ .................................................. G11C 7/00
[52] U.S. Cl. .......................... 365/205; 365/207; 327/51; 327/54
[58] Field of Search ............................ 365/205, 207, 365/208, 189.05; 327/51, 52, 54, 55, 57

[56] References Cited

U.S. PATENT DOCUMENTS

| | | | |
|---|---|---|---|
| 4,027,176 | 5/1977 | Heuber et al. | 327/55 |
| 4,247,791 | 1/1981 | Rovell | 365/205 |
| 4,697,112 | 9/1987 | Ohtani et al. | 365/205 X |
| 5,126,974 | 6/1992 | Sasaki et al. | 365/207 |
| 5,155,397 | 10/1992 | Fassino et al. | 327/55 |
| 5,189,322 | 2/1993 | Chan et al. | 327/54 |

FOREIGN PATENT DOCUMENTS 0057921   5/1979   Japan .......................... 365/205

Primary Examiner—Joseph A. Popek
Assistant Examiner—Son Dinh
Attorney, Agent, or Firm—Morgan & Finnegan

[57] ABSTRACT

A high-speed sense amplifier for a memory device with at least one memory cell, comprising true and complementary bit lines connected to the memory cell, a differential amplification circuit for inputting true and complementary bit data through the true and complementary bit lines, amplifying the inputted true and complementary bit data and transferring the amplified true and complementary bit data to true and complementary data bus lines, respectively, a first feedback loop for feeding the amplified true bit data on the true data bus line back to the memory cell through the true bit line, and a second feedback loop for feeding the amplified complementary bit data on the complementary data bus line back to the memory cell through the complementary bit line. According to the invention, the high-speed sense amplifier can sense and amplify the data on the true and complementary bit lines at a high speed. Therefore, an access speed of the memory device can be enhanced.

9 Claims, 5 Drawing Sheets

HIGH-SPEED SENSE AMPLIFIER HAVING FEEDBACK LOOP

BACKGROUND OF THE INVENTION

1. Field of the Invention

The present invention relates in general to a sense amplifier used in a semiconductor memory device such as a dynamic random access memory (DRAM), and more particularly to a sense amplifier which is capable of minimizing a data sensing time.

2. Description of the Prior Art

A conventional DRAM device has memory cells integrated therein, each of which is comprised of a transistor and a capacitor. The DRAM device is highly integrated to enhance a data storage capacity. However, the high integration of the DRAM device reduces a using voltage and limits a capacitance of the memory cell, thereby causing data to be read from the memory cell under the influence of a considerable noise. The reason is that a charge amount transferred from the memory cell to a bit line is reduced contrary to an integration degree of the DRAM device in reading the data.

Also, the highly integrated DRAM device comprises a sense amplifier for sensing and amplifying accurately and rapidly data of a low voltage on the bit line to enhance a data access speed. The sense amplifier is conventionally of the complementary metal oxide semiconductor (CMOS) latch type as shown in FIG. 1, which possesses a relatively small area and has a relatively stable operation. However, the sense amplifier of the CMOS latch type has a disadvantage in that it requires a long time to sense data on a bit line with a large capacitance because it is connected directly to the bit line. The long sensing time of the sense amplifier of the CMOS latch type causes the data access speed of the DRAM device not to be enhanced beyond a limited speed.

Referring to FIG. 1, the conventional sense amplifier of the CMOS latch type is shown to comprise two PMOS transistors P11 and P12. The PMOS transistors P11 and P12 have sources connected in common to a terminal for inputting a first sense amplifier control signal SAP having a power source voltage Vcc. The PMOS transistor P12 has a gate connected to a true bit line BL and the PMOS transistor P11 has a gate connected to a complementary bit line /BL. The PMOS transistor P11 has a drain connected to the true bit line BL and the PMOS transistor P12 has a drain connected to the complementary bit line /BL. The first PMOS transistor P11 inputs complementary data from a memory cell (not shown) through the complementary bit line /BL at its gate. If the inputted complementary data is "0", the first PMOS transistor P11 transfers the first sense amplifier control signal SAP to the true bit line BL. In this case, true data of "1" on the true bit line BL is amplified to have a voltage value of the first sense amplifier control signal SAP. On the contrary, when true data "0" from the memory cell is applied to the true bit line BL, the second PMOS transistor P12 transfers the first sense amplifier control signal SAP to the complementary bit line /BL. In this case, complementary data of "1" on the complementary bit line /BL is amplified to have the voltage value of the first sense amplifier control signal SAP.

The conventional sense amplifier of the CMOS latch type also comprises two NMOS transistors N11 and N12 connected to form a latch structure between the true and complementary bit lines BL and /BL. The NMOS transistors N11 and N12 have sources connected in common to a terminal for inputting a second sense amplifier control signal /SAN having a ground voltage GND. The NMOS transistor N12 has a gate connected to the true bit line BL and the NMOS transistor N11 has a gate connected to the complementary bit line /BL. The NMOS transistor N11 has a drain connected to the true bit line BL and the NMOS transistor N12 has a drain connected to the complementary bit line /BL. The true and complementary bit lines BL and /BL are connected to true and complementary data bus lines DB and /DB, respectively. The first NMOS transistor N11 inputs complementary data from the memory cell through the complementary bit line /BL at its gate. If the inputted complementary data is "1", the first NMOS transistor N11 transfers the second sense amplifier control signal /SAN to the true bit line BL. In this case, true data of "0" on the true bit line BL is attenuated to have a voltage value of the second sense amplifier control signal /SAN. On the contrary, when true data "1" from the memory cell is supplied to the true bit line BL, the second NMOS transistor N12 transfers the second sense amplifier control signal /SAN to the complementary bit line /BL. In this case, complementary data of "0" on the complementary bit line /BL is attenuated to have the voltage value of the second sense amplifier control signal /SAN. The PMOS and NMOS transistor pairs constituting the sense amplifier of the CMOS latch type are adapted to amplify the true and complementary data on the true and complementary bit lines BL and /BL to make a voltage difference therebetween large.

As mentioned above, the sense amplifier of the CMOS latch type shown in FIG. 1 possesses the relatively small area and has the relatively stable operation due to the small number of circuit elements. However, the sense amplifier of the CMOS latch type has the disadvantage that it requires much time to sense and amplify the data on the bit line with the large capacitance because it is connected directly to the bit line. For this reason, the sense amplifier of the CMOS latch type limits the data access speed of the DRAM device.

SUMMARY OF THE INVENTION

Therefore, the present invention has been made in view of the above problem, and it is an object of the present invention to provide a high-speed sense amplifier for sensing and amplifying data on true and complementary bit lines at a high speed to enhance an access speed of a semiconductor memory device.

In accordance with the present invention, the above and other objects can be accomplished by a provision of a high-speed sense amplifier for a memory device with at least one memory cell, comprising true and complementary bit lines connected to said memory cell; differential amplification means for inputting true and complementary bit data through said true and complementary bit lines, amplifying the inputted true and complementary bit data and transferring the amplified true and complementary bit data to true and complementary data bus lines, respectively; a first feedback loop for feeding the amplified true bit data on said true data bus line back to said memory cell through said true bit line; and a second feedback loop for feeding the amplified complementary bit data on said complementary data bus line back to said memory cell through said complementary bit line.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
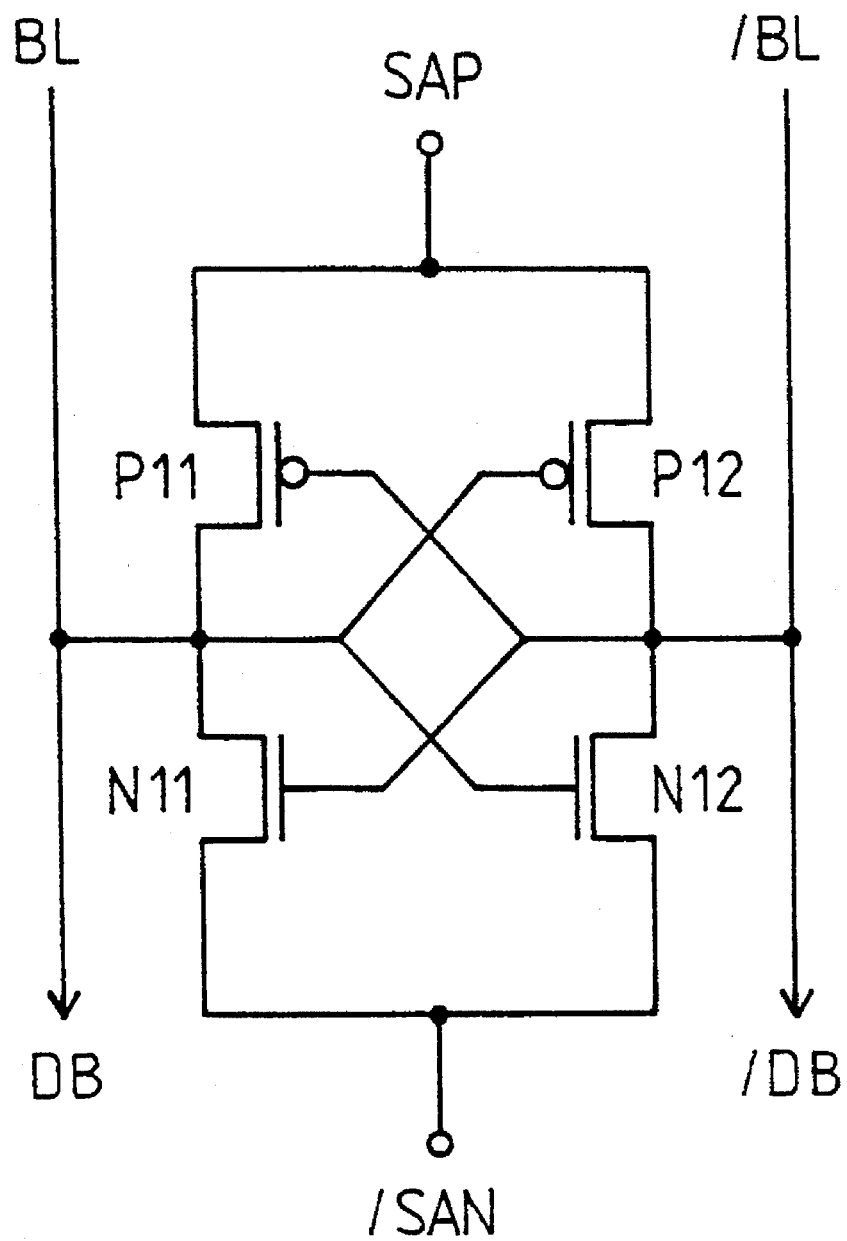
FIG. 1 is a circuit diagram of a conventional sense amplifier of the CMOS latch type.
Figure 2:
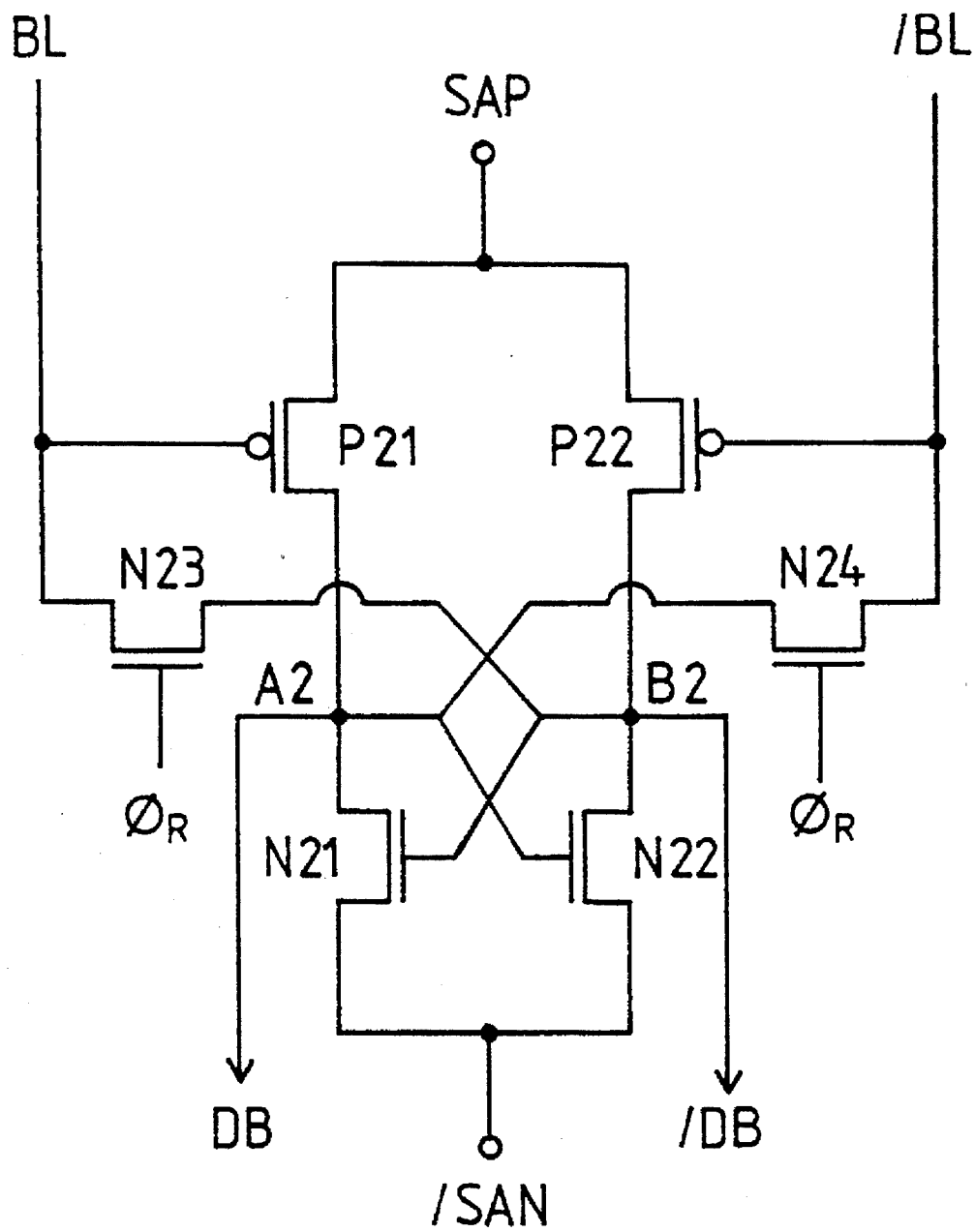
FIG. 2 is a circuit diagram of a first embodiment of a high-speed sense amplifier in accordance with the present invention.

Referring to FIG. 2, there is shown a circuit diagram of a first embodiment of a high-speed sense amplifier in accordance with the present invention. As shown in this drawing, the high-speed sense amplifier comprises a first PMOS transistor P21 for inputting true bit data from a true bit line BL at its gate and a second PMOS transistor P22 for inputting complementary bit data from a complementary bit line /BL at its gate.

Figure 5:
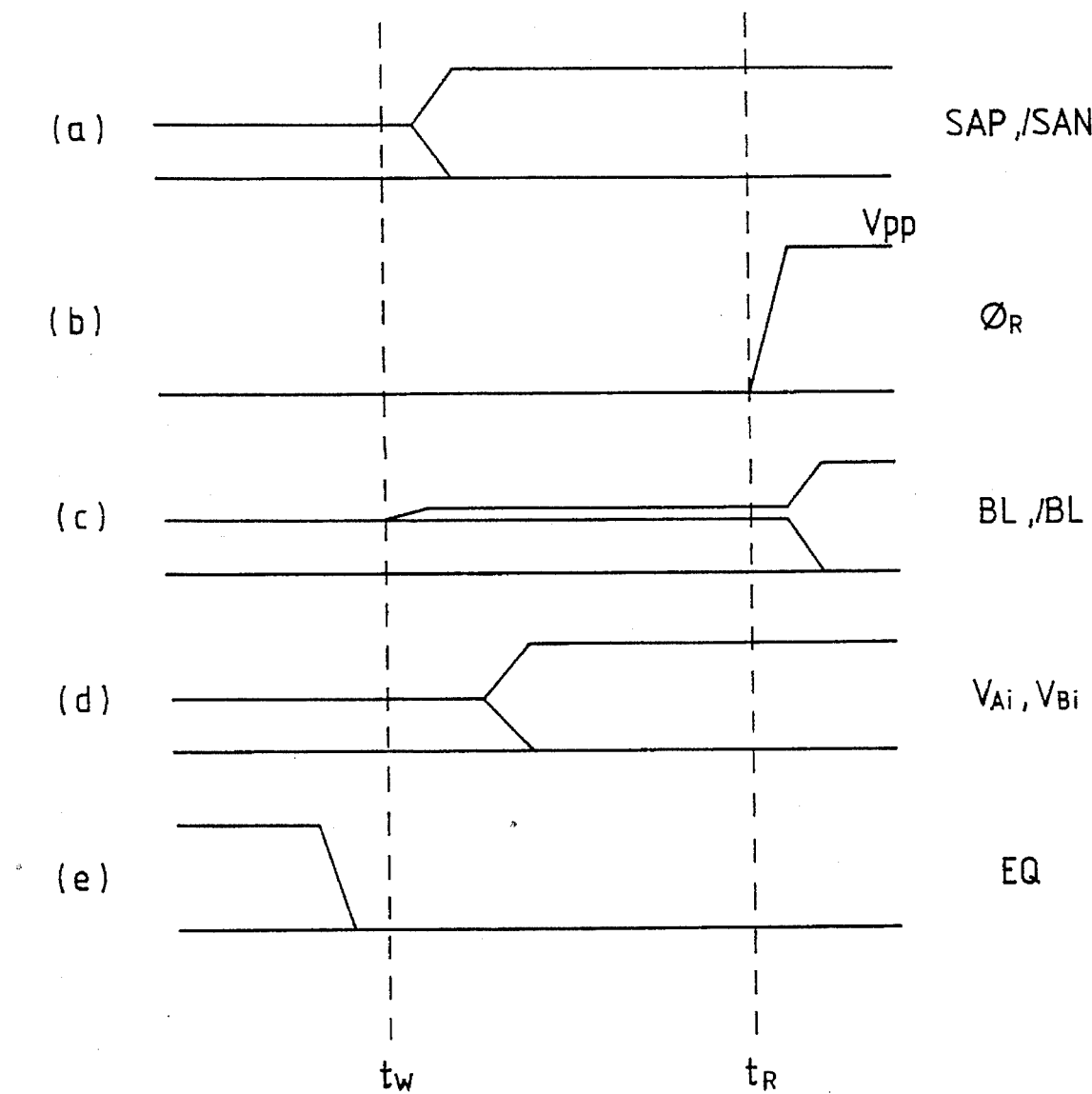
FIG. 5 is timing diagrams of signals from components in FIGS. 2 to 4.

The first PMOS transistor P21 is turned on upon inputting the true bit data of low logic as shown in FIG. 5C at its gate, namely, at time $t_W$, to connect a first control signal input terminal SAP to a true data bus line DB. As a result, a first sense amplifier control signal SAP as shown in FIG. 5A supplied to the first control signal input terminal SAP is transferred to the true data bus line DB through a source and a drain of the first PMOS transistor P21. The first sense amplifier control signal SAP has typically a first power source voltage Vcc. In this case, true cell data with a logical value of "1" is generated on the true data bus line DB due to the first sense amplifier control signal SAP.

The second PMOS transistor P22 is turned on upon inputting the complementary bit data of low logic as shown in FIG. 5C at its gate, namely, at the time $t_W$, to connect the first control signal input terminal SAP to a complementary data bus line /DB. As a result, the first sense amplifier control signal SAP supplied to the first control signal input terminal SAP is transferred to the complementary data bus line /DB through a source and a drain of the second PMOS transistor P22. In this case, complementary cell data with a logical value of "1" is generated on the complementary data bus line /DB due to the first sense amplifier control signal SAP.

Also, the high-speed sense amplifier comprises a first NMOS transistor N21 for inputting the complementary cell data from the complementary data bus line /DB at its gate and a second NMOS transistor N22 for inputting the true cell data from the true data bus line DB at its gate. The first NMOS transistor N21 is turned on upon inputting the complementary cell data of high logic at its gate, to connect a second control signal input terminal /SAN to the true data bus line DB. As a result, a second sense amplifier control signal /SAN as shown in FIG. 5A supplied to the second control signal input terminal /SAN is transferred to the true data bus line DB through a source and a drain of the first NMOS transistor N21. The second sense amplifier control signal /SAN has typically a ground voltage GND. In this case, true cell data with a logical value of "0" is generated on the true bus line DB due to the second sense amplifier control signal /SAN. In result, the true bit data on the true bit line BL is inverse-amplified by the first PMOS transistor P21 and the first NMOS transistor N21 and then applied to the true data bus line DB.

The second NMOS transistor N22 is turned on upon inputting the true cell data of high logic at its gate, to connect the second control signal input terminal /SAN to the complementary data bus line /DB. As a result, the second sense amplifier control signal /SAN as shown in FIG. 5A supplied to the second control signal input terminal /SAN is transferred to the complementary data bus line /DB through a source and a drain of the second NMOS transistor N22. In this case, complementary cell data with a logical value of "0" is generated on the complementary data bus line /DB due to the second sense amplifier control signal /SAN. In result, the complementary bit data on the complementary bit line /BL is inverse-amplified by the second PMOS transistor P22 and the second NMOS transistor N22 and then applied to the complementary data bus line /DB.

Further, the high-speed sense amplifier comprises third and fourth NMOS transistors N23 and N24 for inputting a recovery control signal $\phi_R$ as shown in FIG. 5B from a third control signal input terminal $\phi_R$ at their gates. The recovery control signal $\phi_R$ has a second power source voltage Vpp which is at least 0.7 V higher than the first sense amplifier control signal SAP.

The third NMOS transistor N23 is turned on upon inputting the recovery control signal $\phi_R$ of high logic at its gate, namely, at time $t_R$, to transfer the inverse-amplified complementary cell data on the complementary data bus line /DB to a memory cell (not shown) through its drain and source and the true bit line BL. As a result, pre-stored true bit data is refreshed from the memory cell according to the inverse-amplified complementary cell data from the true bit line BL.

The fourth NMOS transistor N24 is turned on upon inputting the recovery control signal $\phi_R$ of high logic at its gate, namely, at the time $t_R$, to transfer the inverse-amplified true cell data on the true data bus line DB to the memory cell through its drain and source and the complementary bit line /BL. As a result, pre-stored complementary bit data is refreshed from the memory cell according to the inverse-amplified true cell data from the complementary bit line /BL.

In result, the first and second PMOS transistors P21 and P22 and the first and second NMOS transistors N21 and N22 function as a differential amplifier for inverse-amplifying the true and complementary bit data on the true and complementary bit lines BL and /BL. The third and fourth NMOS transistors N23 and N24 function as a control feedback loop for feeding the true and complementary cell data back to the memory cell to refresh the bit data pre-stored in the memory cell. In the high-speed sense amplifier, the sensing, amplifying and refreshing operations are performed together at one reading period by the first and second PMOS transistors P21 and P22 and the first and second NMOS transistors N21 and N22 constituting the differential amplifier and the third and fourth NMOS transistors N23 and N24 constituting the feedback loop.

Figure 3:
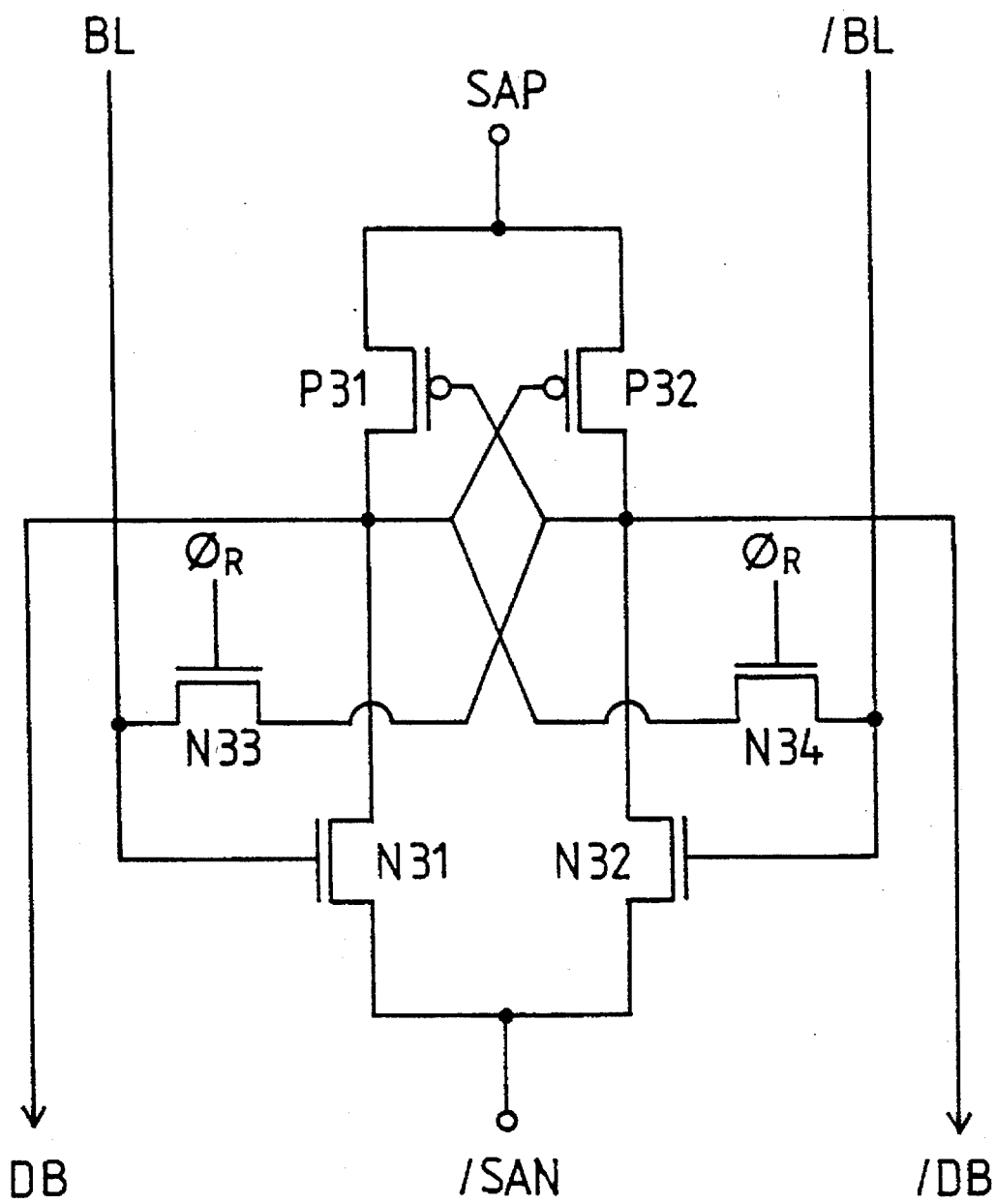
FIG. 3 is a circuit diagram of a second embodiment of the high-speed sense amplifier in accordance with the present invention.

Referring to FIG. 3, there is shown a circuit diagram of a second embodiment of the high-speed sense amplifier in accordance with the present invention. As shown in this drawing, the high-speed sense amplifier comprises a first NMOS transistor N31 for inputting the true bit data from the true bit line BL at its gate and a second NMOS transistor N32 for inputting the complementary bit data from the complementary bit line /BL at its gate.

The first NMOS transistor N31 is turned on upon inputting the true bit data of high logic as shown in FIG. 5C at its gate, namely, at the time $t_W$, to connect the second control signal input terminal /SAN to the true data bus line DB. As a result, the second sense amplifier control signal /SAN as shown in FIG. 5A supplied to the second control signal input terminal /SAN is transferred to the true data bus line DB through a source and a drain of the first NMOS transistor N31. In this case, true cell data with a logical value of "0" is generated on the true data bus line DB due to the second sense amplifier control signal /SAN.

The second NMOS transistor N32 is turned on upon inputting the complementary bit data of high logic as shown in FIG. 5C at its gate, namely, at the time $t_W$, to connect the second control signal input terminal /SAN to the complementary data bus line /DB. As a result, the second sense amplifier control signal /SAN supplied to the second control signal input terminal /SAN is transferred to the complementary data bus line /DB through a source and a drain of the second NMOS transistor N32. In this case, complementary cell data with a logical value of "0" is generated on the complementary data bus line /DB due to the second sense amplifier control signal /SAN.

The high-speed sense amplifier also comprises a first PMOS transistor P31 for inputting the complementary cell data from the complementary data bus line /DB at its gate and a second PMOS transistor P32 for inputting the true cell data from the true data bus line DB at its gate. The first PMOS transistor P31 is turned on upon inputting the complementary cell data of low logic at its gate, to connect the first control signal input terminal SAP to the true data bus line DB. As a result, the first sense amplifier control signal SAP as shown in FIG. 5A supplied to the first control signal input terminal SAP is transferred to the true data bus line DB through a source and a drain of the first PMOS transistor P31. In this case, true cell data with a logical value of "1" is generated on the true data bus line DB due to the first sense amplifier control signal SAP. In result, the true bit data on the true bit line BL is inverse-amplified by the first PMOS transistor P31 and the first NMOS transistor N31 and then applied to the true data bus line DB.

The second PMOS transistor P32 is turned on upon inputting the true cell data of low logic at its gate, to connect the first control signal input terminal SAP to the complementary data bus line /DB. As a result, the first sense amplifier control signal SAP as shown in FIG. 5A supplied to the first control signal input terminal SAP is transferred to the complementary data bus line /DB through a source and a drain of the second PMOS transistor P32. In this case, complementary cell data with a logical value of "1" is generated on the complementary data bus line /DB due to the first sense amplifier control signal SAP. In result, the complementary bit data on the complementary bit line /BL is inverse-amplified by the second PMOS transistor P32 and the second NMOS transistor N32 and then applied to the complementary data bus line /DB.

Further, the high-speed sense amplifier comprises third and fourth NMOS transistors N33 and N34 for inputting the recovery control signal $\phi_R$ as shown in FIG. 5B from the third control signal input terminal $\phi_R$ at their gates. The third NMOS transistor N33 is turned on upon inputting the recovery control signal $\phi_R$ of high logic at its gate, namely, at the time $t_R$, to transfer the inverse-amplified complementary cell data on the complementary data bus line /DB to the memory cell through its drain and source and the true bit line BL. As a result, pre-stored true bit data is refreshed from the memory cell according to the inverse-amplified complementary cell data from the true bit line BL.

On the other hand, the fourth NMOS transistor N34 is turned on upon inputting the recovery control signal $\phi_R$ of high logic at its gate, namely, at the time $t_R$, to transfer the inverse-amplified true cell data on the true data bus line DB to the memory cell through its drain and source and the complementary bit line /BL. As a result, pre-stored complementary bit data is refreshed from the memory cell according to the inverse-amplified true cell data from the complementary bit line /BL.

In result, the first and second PMOS transistors P31 and P32 and the first and second NMOS transistors N31 and N32 function as a differential amplifier for inverse-amplifying the true and complementary bit data on the true and complementary bit lines BL and /BL. The third and fourth NMOS transistors N33 and N34 function as a control feedback loop for feeding the true and complementary cell data back to the memory cell to refresh the bit data pre-stored in the memory cell. In the high-speed sense amplifier, the sensing, amplifying and refreshing operations are performed together at one reading period by the first and second PMOS transistors P31 and P32 and the first and second NMOS transistors N31 and N32 constituting the differential amplifier and the third and fourth NMOS transistors N33 and N34 constituting the feedback loop.

Figure 4:
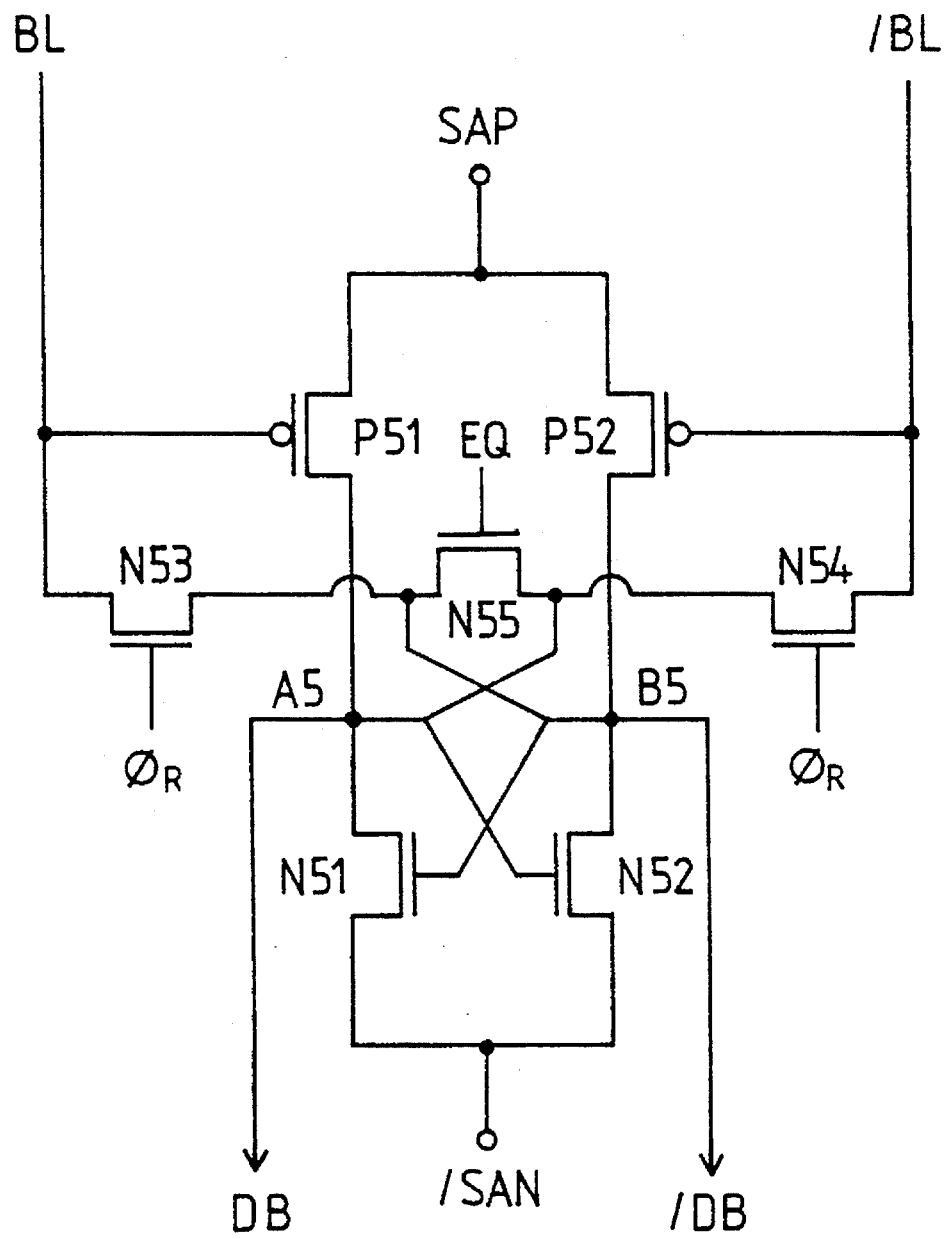
FIG. 4 is a circuit diagram of a third embodiment of the high-speed sense amplifier in accordance with the present invention.

Referring to FIG. 4, there is shown a circuit diagram of a third embodiment of the high-speed sense amplifier in accordance with the present invention. As shown in this drawing, the high-speed sense amplifier comprises first and second PMOS transistors P51 and P52 and first to fourth NMOS transistors N51–N54, which are the same in construction and operation as the first and second PMOS transistors P21 and P22 and the first to fourth NMOS transistors N21–N24 in FIG. 2. Thus, a description of the constructions and operations of the first and second PMOS transistors P51 and P52 and first to fourth NMOS transistors N51–N53 will be omitted.

The high-speed sense amplifier further comprises a fifth NMOS transistor N55 for inputting an equalization control signal EQ from a fourth control signal input terminal EQ at its gate. As shown in FIG. 5E, the equalization control signal EQ has a high logic in a non-operation interval in which the high-speed sense amplifier does not inverse-amplify the true and complementary bit data on the true and complementary bit lines BL and /BL, namely, the true and complementary bit lines BL and /BL are precharged by a precharge circuit (not shown). The fifth NMOS transistor N55 is turned on upon inputting the equalization control signal EQ of high logic at its gate, to electrically connect the true and complementary data bus lines DB and /DB to each other. The true and complementary data bus lines DB and /DB have the same voltage level within a short time when being electrically connected to each other by the fifth NMOS transistor N55. In result, the fifth NMOS transistor N55 functions to precharge the true and complementary data bus lines DB and /DB within a short time.

As apparent from the above description, according to the present invention, the high-speed sense amplifier can sense and amplify the data on the bit line connected to the memory cell regardless of a capacitor of the memory cell by separating the bit line from the data bus line. Also, the high-speed sense amplifier can sense and amplify the data on the bit line at a high speed, because it is not influenced by the capacitor of the memory cell. Therefore, an access speed of a semiconductor memory device can be enhanced beyond a limited speed. Further, the true and complementary data bus lines are compulsorily connected to each other. Therefore, the precharge or initialization of the data bus line can be performed within a short time.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A high-speed sense amplifier for a memory device with at least one memory cell, comprising:

true and complementary bit lines connected to said memory cell;

differential amplification means for inputting true and complementary bit data through said true and complementary bit lines, amplifying the inputted true and complementary bit data and transferring the amplified true and complementary bit data to true and complementary data bus lines, respectively;

a first feedback loop for feeding the amplified true bit data on said true data bus line back to said memory cell through said complementary bit line; and a second feedback loop for feeding the amplified complementary bit data on said complementary data bus line back to said memory cell through said true bit line.

2. A high-speed sense amplifier as set forth in claim 1, wherein said first and second feedback loops are driven after a lapse of a predetermined time period from an operation start time point of said differential amplification means.

3. A high-speed sense amplifier as set forth in claim 2, wherein said differential amplification means includes:

first switching means for switching a first control signal of high logic from a first control signal input line to said true data bus line in response to the true bit data from said true bit line;

second switching means for switching the first control signal from said first control signal input line to said complementary data bus line in response to the complementary bit data from said complementary bit line;

third switching means for switching a second control signal of low logic from a second control signal input line to said true data bus line in response to the complementary bit data from said complementary data bus line; and fourth switching means for switching the second control signal from said second control signal input line to said complementary data bus line in response to the true bit data from said true data bus line.

4. A high-speed sense amplifier as set forth in claim 3, wherein each of said first to fourth switching means includes an MOS transistor.

5. A high-speed sense amplifier for a memory device with at least one memory cell, comprising:

true and complementary bit lines connected to said memory cell;

differential amplification means for inputting true and complementary bit data through said true and complementary bit lines, inverse-amplifying the inputted true and complementary bit data and transferring the inverse-amplified true and complementary bit data to true and complementary data bus lines, respectively;

a first feedback loop for feeding the inverse-amplified true bit data on said true data bus line back to said memory cell through said complementary bit line; and a second feedback loop for feeding the inverse-amplified complementary bit data on said complementary data bus line back to said memory cell through said true bit line.

6. A high-speed sense amplifier as set forth in claim 5, wherein said differential amplification means includes:

first switching means for switching a first control signal of high logic from a first control signal input line to said true data bus line in response to the true bit data from said true bit line;

second switching means for switching the first control signal from said first control signal input line to said complementary data bus line in response to the complementary bit data from said complementary bit line;

third switching means for switching a second control signal of low logic from a second control signal input line to said true data bus line in response to the complementary bit data from said complementary data bus line; and fourth switching means for switching the second control signal from said second control signal input line to said complementary data bus line in response to the true bit data from said true data bus line.

7. A high-speed sense amplifier as set forth in claim 6, wherein each of said first and second switching means includes a PMOS transistor and each of said third and fourth switching means includes an NMOS transistor.

8. A high-speed sense amplifier as set forth in claim 5, wherein said first and second feedback loops are driven after a lapse of a predetermined time period from an operation start time point of said differential amplification means.

9. A high-speed sense amplifier as set forth in claim 5, further comprising:

equalization means being driven in complementary cooperation with said differential amplification means for electrically connecting said true and complementary data bus lines to each other to enhance a precharge speed of said true and complementary data bus lines.

* * * * *